United States Patent
Thayer

(10) Patent No.: US 7,975,205 B2
(45) Date of Patent: Jul. 5, 2011

(54) ERROR CORRECTION ALGORITHM SELECTION BASED UPON MEMORY ORGANIZATION

(75) Inventor: Larry J. Thayer, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1158 days.

(21) Appl. No.: 11/627,519

(22) Filed: Jan. 26, 2007

(65) Prior Publication Data

US 2008/0184093 A1 Jul. 31, 2008

(51) Int. Cl.
*G11C 29/00* (2006.01)
(52) U.S. Cl. ...................................................... 714/763
(58) Field of Classification Search .................. 714/763, 714/758
See application file for complete search history.

(56) References Cited

U.S. PATENT DOCUMENTS

| | | | |
|---|---|---|---|
| 4,862,463 A | 8/1989 | Chen | |
| 5,226,043 A | 7/1993 | Pughe, Jr. et al. | |
| 5,511,078 A | 4/1996 | Barucchi et al. | |
| 5,961,660 A * | 10/1999 | Capps et al. | 714/763 |
| 6,363,502 B1 * | 3/2002 | Jeddeloh | 714/52 |
| 6,493,843 B1 | 12/2002 | Raynham | |
| 6,584,543 B2 * | 6/2003 | Williams et al. | 711/105 |
| 6,751,769 B2 | 6/2004 | Chen et al. | |
| 6,973,612 B1 | 12/2005 | Rodi | |
| 7,028,213 B2 * | 4/2006 | Majni et al. | 714/5 |
| 7,117,421 B1 | 10/2006 | Danilak | |
| 7,191,382 B2 * | 3/2007 | James et al. | 714/769 |
| 7,320,086 B2 * | 1/2008 | Majni et al. | 714/5 |
| 7,398,449 B1 * | 7/2008 | Normoyle et al. | 714/767 |
| 7,559,004 B1 * | 7/2009 | Chang et al. | 714/758 |
| 2003/0140300 A1 | 7/2003 | Chen et al. | |
| 2004/0128465 A1 | 7/2004 | Lee et al. | |

* cited by examiner

*Primary Examiner* — Esaw T Abraham

(57) ABSTRACT

A method is provided for implementing at least one of a number of error correction algorithms operable on a memory. In the method, each of the error correction algorithms is provided. At least one of the error correction algorithms is then selected based on the organization of the memory. At least one error in the memory is corrected using the selected error correction algorithm.

28 Claims, 4 Drawing Sheets

ERROR CORRECTION ALGORITHM SELECTION BASED UPON MEMORY ORGANIZATION

BACKGROUND

Common to nearly all computing system platforms is the need for substantial amounts of reliable random-access digital memory. Such memory is often employed to contain software, such as operating system and application software, as well as data utilized by these programs. Further, capacity, speed, and reliability requirements for memory for these platforms continue to become more stringent. In addition, a memory controller is often included as part of the memory system to facilitate computer system access to large memory.

In many systems, such as high-performance desktop computing platforms and network servers, memory requirements have been satisfied primarily by one or more dual in-line memory modules (DIMMs), each of which is populated with several dynamic random-access memory (DRAM) devices. Typically, each DIMM provides one or two "ranks," or portions of the address range of the memory. Each rank includes a number of DRAMs, with each DRAM providing a predetermined number of bits of each addressable word of the rank. Unfortunately, the increase in capacity delivered by DIMMs has been accompanied with a concomitant increase in the occurrence of data errors, necessitating the use of error correction schemes or algorithms to detect and correct the errors. To facilitate these schemes, each DIMM often provides one or more additional DRAMs beyond what the associated computing system requires for its data requirements to allow the attendant memory controller to store error correction data along with the user data in the DIMM.

Current error correction algorithms are often able to correct data associated with one or more entire DRAMs. In this case, for each word in a rank, the error correction scheme would have the capacity to correct at least all bits of a single DRAM for each word of the rank. Such capability is advantageous since "hard," or permanent, failures often affect a significant portion of a single DRAM. To this end, the memory controller often implements an error correction algorithm that is optimized for the particular DRAM bit-width being employed in the memory system. For example, DIMMs are often designed to use DRAMs providing thousands of memory locations, with each location providing a bit-width of either four or eight. Presuming an error correction algorithm optimized to correct any DRAM of a system employing eight-bit DRAMs, use of the same error correction algorithm in a memory system using four-bit DRAMs likely would not allow replacement of any two of the DRAMs, unlike an error correction algorithm specifically optimized for four-bit DRAMs. Thus, memory systems are typically designed to align the error correction algorithm employed in the memory controller with the particular DRAM devices utilized in the DIMMs to maximize memory system reliability.

However, correlating the error correction algorithm with the type of DRAM employed produces some limitations. For example, a computing system may be designed to accept two or more types of DIMMs differentiated by DRAM bit-widths. Such a system design may be beneficial over the life of the system, as one type of DIMM may be more desirable over another in terms of pricing and availability at various points in time. Thus, as replacements for failed DIMMs in the system are required, the types of DIMMs employed in any one system may change over time. The same holds true during production of a computing product, as the purchase of one DIMM type may be more attractive than another due to prevailing market conditions. In either case, the option of employing one DIMM type over another would not be available if the memory controller is designed and optimized for DIMMs of a specific DRAM bit-width.

DETAILED DESCRIPTION

Figure 1:
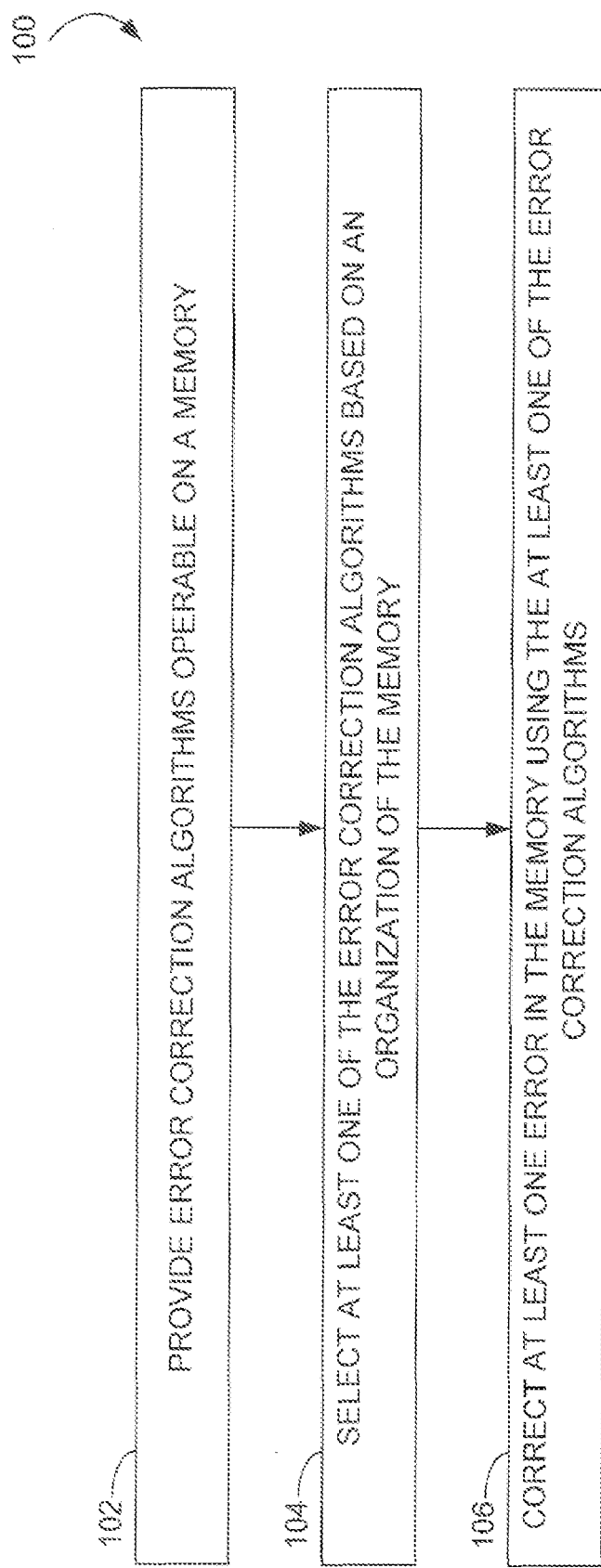
FIG. 1 is a flow diagram of a method according to an embodiment of the invention for implementing a number of error correction algorithms operable on a memory.

FIG. 1 provides a flow diagram of a method 100 for implementing a number of error correction algorithms operable on a memory. The error correction algorithms are provided for use with the memory (operation 102). At least one of the error correction algorithms is then selected based on an organization of the memory (operation 104). At least one error in the memory is then corrected using the selected error correction algorithm (operation 106).

Figure 2:
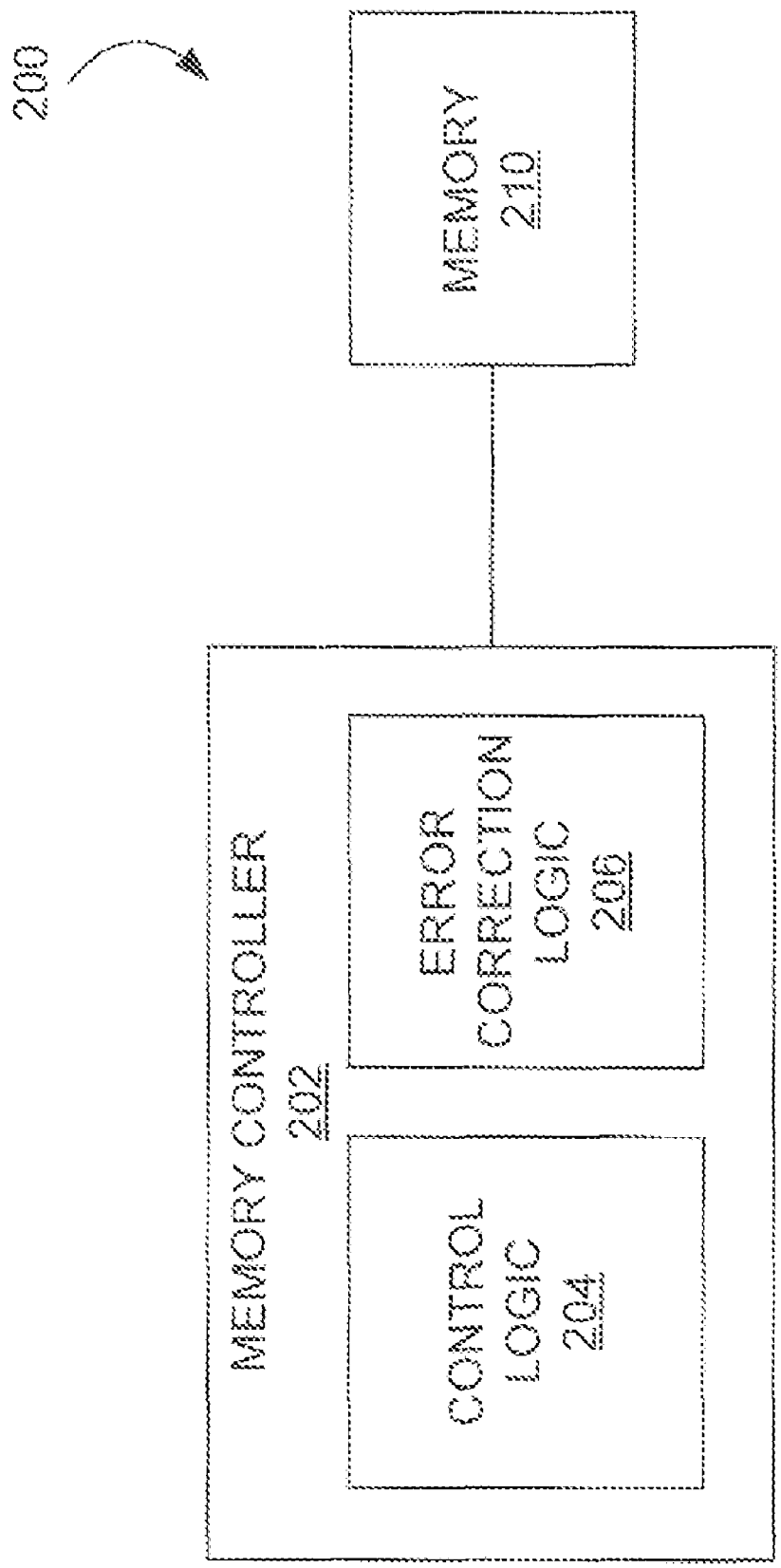
FIG. 2 is a block diagram of a memory system including a memory controller according to an embodiment of the invention.

Another embodiment, a memory controller 202 employed within a memory system 200, is illustrated in FIG. 2. The memory system includes the memory controller 202 coupled with a memory 210. Generally, the memory controller 202 comprises control logic 204 and error correction logic 206. The error correction logic 206 is configured to provide a number of error correction algorithms operable on the memory 210. The control logic 204 is configured to select at least one of the error correction algorithms provided by the error correction logic 206 based on an organization of the memory 210. The error correction logic 206 is further configured to correct at least one error in the memory 210 using the selected error correction algorithm.

Figure 3:
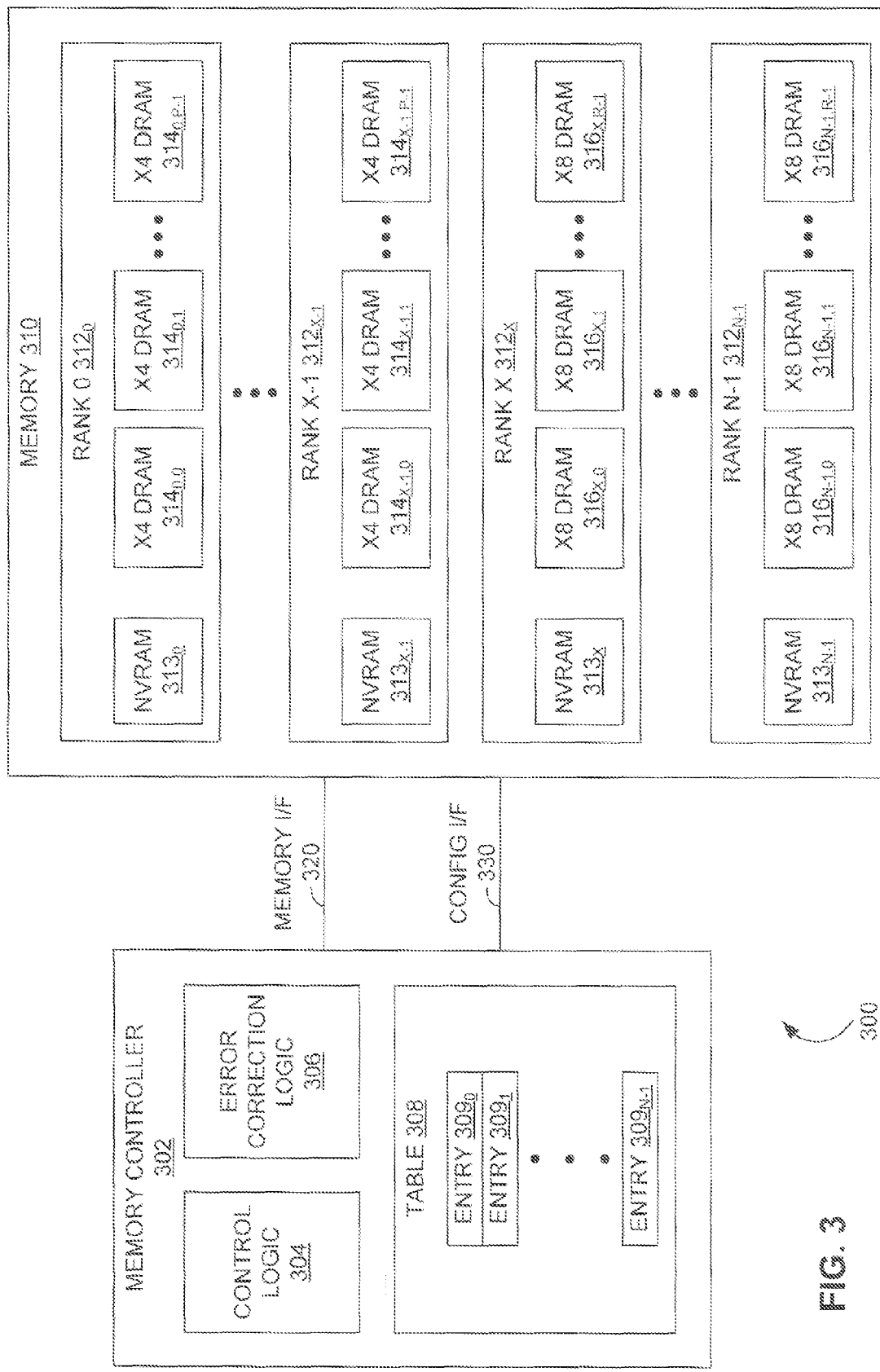
FIG. 3 is a block diagram of a memory system including a memory controller according to another embodiment of the invention, wherein the memory system employs both four-bit-wide DRAMs and eight-bit-wide DRAMs.

Another embodiment of the invention—a memory controller 302 within a memory system 300—is depicted in the block diagram of FIG. 3. The memory system 300 includes a memory 310 comprising N ranks $312_0$ to $312_{N-1}$. Each rank 312 provides memory for a predefined exclusive portion of the memory address space accessible within a computer system through the memory controller 302. In one embodiment, each rank 312 is located on a DIMM, wherein the DIMM may include one or two ranks 312. In the particular embodiment of FIG. 3, each DIMM contains one rank 312.

Each rank 312, in turn, includes either a first number P of four-bit-wide (×4) DRAM memory devices 314 or a second number R of eight-bit-wide (×8) DRAM memory devices 316. In the specific example of FIG. 3, X ranks 312 include the ×4 DRAMs 314, and N-X ranks 312 employ the ×8 DRAMs 316. In one embodiment, P equals eighteen and R equals nine. In one particular implementation, sixteen of the ×4 DRAMs 314 (64 bits) in each of the first X ranks 312 contain user data, while the remaining two ×4 DRAMs 314 (8 bits) each contains error correction data employed by the memory controller 302 to detect and correct errors in the rank 312. In the last N-X ranks 312, eight of the ×8 DRAMs 316

(64 bits) contain user data, while the remaining ×8 DRAM 316 (8 bits) holds the error correction data.

Other organizations of the memory 310 may be employed in other embodiments. For example, all ranks 312 may contain either all ×4 DRAMs, all ×8 DRAMs, or DRAMs of other bit-widths. In another implementation, each rank 312 may span two or more DIMMs coupled in parallel, thus allowing more error correction data to be present in each addressable location of the memory 310, thereby strengthening the capability of the particular error correction algorithm employed for that rank 312. Other memory technologies, such as SRAMs, may be employed in the alternative. Also, single in-line memory modules (SIMMs) may replace the DIMMs of FIG. 3, or some other memory module may be employed instead.

Each DIMM of FIG. 3 also contains a nonvolatile memory 313 which holds configuration data describing the organization and other characteristics of the associated DIMM. For example, the nonvolatile memory 313 of a DIMM holds information indicating the bit-width of the DRAMs 314, 316 carried on the DIMM. Other information, such as the number of ranks, capacity or address range of the DIMM, and type of DRAM (for example, fast page mode, double data rate (DDR), extended data out (EDO), synchronous (SDRAM), and so on), may be provided in the nonvolatile memory 313. In one embodiment, the nonvolatile memory 313 is a programmable read-only memory (PROM), although other forms of nonvolatile storage, such as flash memory, may be utilized in other examples. Also, the configuration information may conform to the serial presence detect (SPD) standard often employed in DIMMs.

Similar to the memory controller 202 of FIG. 2, the memory controller 302 of FIG. 3 includes control logic 304 and error correction logic 306. By design, the error correction logic 306 of the memory controller 302 is capable of generating error correction data, as well as detecting and correcting errors in the memory 310, according to multiple error correction algorithms. Each algorithm may be optimized for a particular organization of the memory 310. For example, one algorithm may be optimized for use with the ×8 DRAMs 316 so that an entire ×8 DRAM 316 of any data word may be corrected. Another algorithm may be optimized for use with the ×4 DRAMs 314 so that any two ×4 DRAMs 314 of each data word may be corrected. As described above, one algorithm generally is not capable of being providing optimal error correction capability for both types of DRAMs 314, 316. Other operational characteristics of the control logic 304 and the error correction logic 306 are described in greater detail below.

The memory controller 302 also includes a table 308 containing multiple entries 309. In one embodiment, each entry 309 is associated with a rank 312 of the memory 310, wherein each entry 309 includes an indication of the bit-width of the DRAMs used in that rank 312. In another implementation, each entry 309 is associated with an address range of the memory 310, and includes an indication of the bit-width of the DRAMs used in that particular range.

The memory controller 302 and the memory 310 of FIG. 3 are coupled together by at least a pair of connections. A memory interface 320 carries memory address and data information between the memory controller 302 and the memory 310 for implementing memory read and write accesses, while a configuration interface 330 carries information from each of the nonvolatile memories 313 to the memory controller 302. In one example, the configuration interface 330 is a serial interface employable in the SPD environment.

Figure 4:
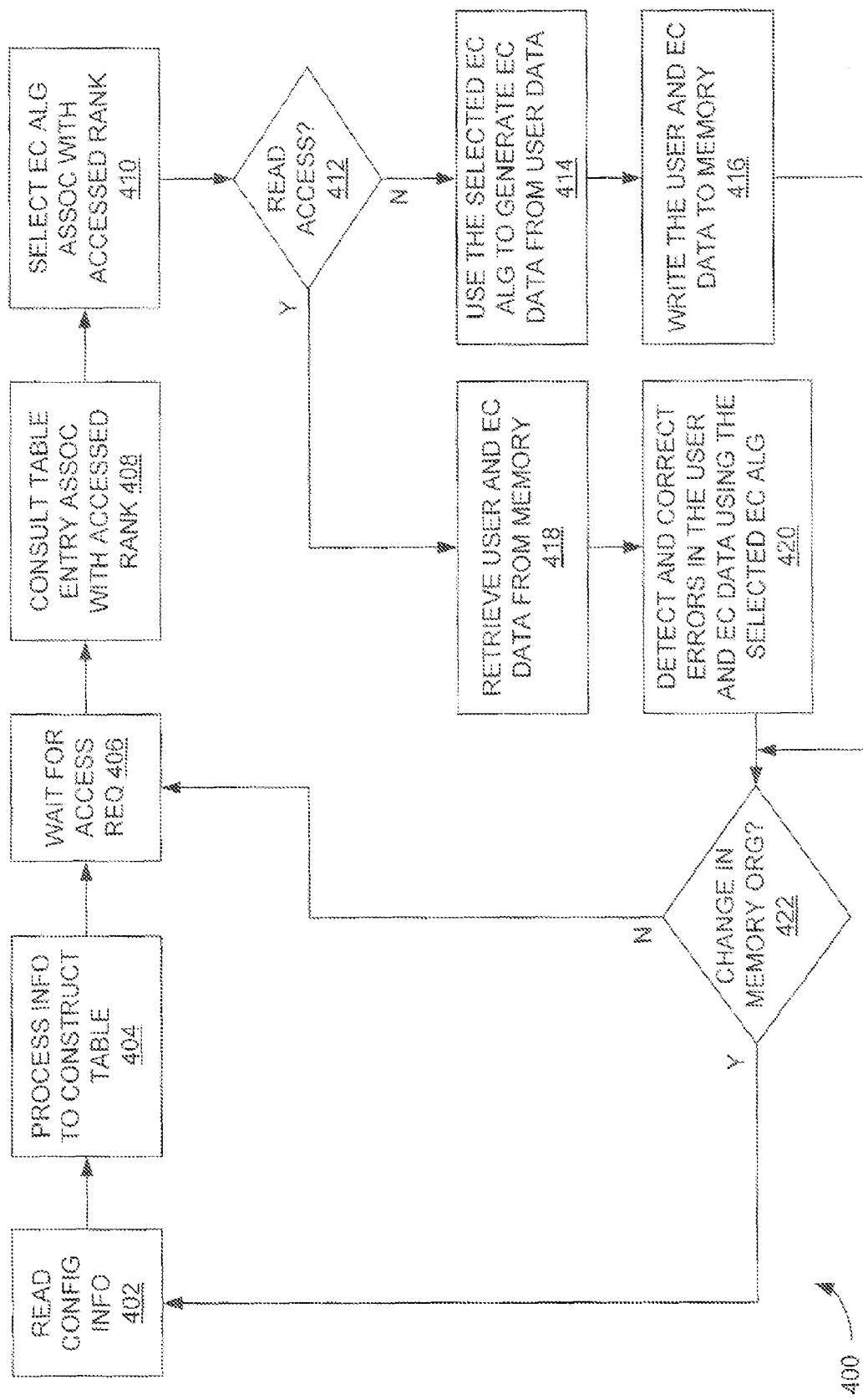
FIG. 4 is a flow diagram of a method according to another embodiment of the invention for implementing a number of error correction algorithms operable on a memory.

FIG. 4 presents a flow diagram describing a method 400 of operating of the memory controller 302 of FIG. 3 according to one embodiment of the invention. The memory controller 302, by way of its control logic 304, reads information regarding the organization of the memory 310, such as address ranges or capacities of each memory rank 312, and the bit-width of the DRAMs 314, 316 associated with each of the ranks 312 (operation 402). This information is obtained by reading the SPD information in the nonvolatile memory 313 of each of the DIMMs of the memory 310 by way of the configuration interface 330. In one example, this operation is first performed at the initialization of the memory system 300 after power-up.

The control logic 304 then processes the information regarding the organization of the memory 313 to construct the entries 309 of the table 308 (operation 404). In the embodiment of FIG. 3, the table 308 includes N entries 309, wherein each entry 309 is associated with a rank 312 of the memory 310. Each entry 309 thus includes an indication of the bit-width of the DRAMs 314 associated with that rank 312. In the particular example of FIG. 3, the first X entries 309 of the table 308 (i.e., entry $309_0$ to entry $309_{X-1}$) each would indicate a bit-width of four, while the remaining N-X entries 309 (i.e., entry $309_X$ to entry $309_{N-1}$) each would indicate a bit-width of eight. Each entry 309 may also include an indication of the lower and upper address boundaries for the associated rank 312, which may be useful in systems 300 which employ different capacities among the ranks 312. Other logical structures for the table 308 may be employed in other embodiments.

After the control logic 304 constructs the table 308, the memory controller 302, by way of the error correction logic 306, employs the memory interface 320 to perform read and write operations on the memory 310. Ordinarily, the memory controller 302 performs these operations in response to a request for access received from a processor (not shown in FIG. 3). The memory controller 302 also performs other accesses not initiated by a processor, such as refreshing of DRAM memory. In one embodiment, the memory controller 302 also performs memory scrubbing, or periodic reading and selective writing of the memory 310 to correct detected errors.

In response to an internal request (i.e., a request originating from inside the memory controller 302) or an external request (i.e., a request originating from outside the memory controller 302) to access the memory 313 (operation 406), the error correction logic 306 consults the table entry 309 associated with the rank 312 being accessed to determine the bit-width of the DRAMs 314 of that rank 312 (operation 408). The error correction logic then selects the particular error correction algorithm associated with that bit-width (operation 410). In one embodiment, the each of the error correction algorithms may be a Reed-Solomon error correction algorithm. In other implementations, each of the error correction algorithms may be an algorithm other than a Reed-Solomon error correction algorithm. Also, a mixture of Reed-Solomon algorithms and others may be employed within the error correction logic 306.

Thereafter, in the case of a write operation (operation 412), the error correction logic 306 uses the selected error correction algorithm to generate the appropriate error correction data for the user data to be written to the accessed rank 312 (operation 414). The user data and the error correction data are then both written to the accessed rank 312 by way of the memory interface 320 (operation 416). For example, if the accessed rank 312 contains eighteen ×4 DRAMs 314, the memory controller 302, in conjunction with the error correction logic 306, may write the user data for each accessed data word to sixteen of the ×4 DRAMs 314, and write the associated error correction data to the remaining two ×4 DRAMs 314. If, instead, the accessed rank 312 utilizes nine ×8 DRAMs 316, the memory controller 302 writes the user data for each accessed data word to eight of the ×8 DRAMs 316, and writes the corresponding error correction data to the remaining ×8 DRAM 316.

If the requested access to the memory 310 is a read operation (operation 412), the memory controller 302 retrieves one or more data words from the accessed rank 312 by way of the memory interface 320 (operation 418). In one embodiment, each of the data words contains user data and error correction data. The error correction logic 306 then detects and corrects errors in the data words by processing the user data and the error correction data with the selected error correction algorithm associated with the accessed rank 312, as discussed above (operation 420).

After each read or write operation, the memory controller 302 is configured to respond to each subsequent memory access as before, wherein the control logic 304 utilizes the entry 309 of the table 308 corresponding to the rank 312 being accessed to determine which error correction algorithm to employ for that particular memory access.

In one embodiment, the memory controller 302 may adapt to changes in the organization of the memory 310 while the memory system 300 remains in an operational state. For example, the memory system 300 may be configured as a "hotplug" system, in which a defective DIMM may be removed from, or replaced in, the memory 310, or a new DIMM may be added to the memory 310, while the memory system 300 continues to operate. In such an embodiment, the memory controller 302 is configured to detect if one of the DIMMs of the memory 310 has been removed, replaced or added (operation 422). If so, the control logic 304 once again reads the configuration information from each of the DIMMs regarding the organization of the memory 310 associated with each of the ranks 312 by way of the configuration interface 330 (operation 402), and processes the information to construct the entries 309 of the table 308 (operation 404).

In another embodiment, the organization of the memory 310 may not be detected electronically, such as by way of the configuration interface 330 and the SPD standard discussed above, so that the entries 309 of the table 308 are written appropriately. In that case, a computer operator may be cognizant of the organization of the memory 310, including the types of DRAMs 314, 316 employed. As a result, the operator may directly or indirectly enter the necessary information into the entries 309 of the table 308 describing the organization of the memory 310, such as by way of keyboard entry through an operator panel or other means. Such an alternative may eliminate the need for the configuration interface 330 and associated logic, thus simplifying the design of the memory system 300.

As described above, various embodiments of the present invention allow a single memory controller to provide any of a number of possible error correction algorithms, and to select the most appropriate of those algorithms for the particular memory organization involved. Therefore, the same memory controller may be employed in a number of different computing systems, each of which incorporates a different type of DIMM or other memory configuration, thus maintaining a high level of memory reliability while providing flexibility in the types of DIMMs employed. In some implementations, the memory controller may select the correct error correction algorithm on a per-rank basis for memory systems that employ diverse types of DIMM organizations simultaneously. In addition, some embodiments are capable of adjusting the type of algorithm involved long after initial power-up to benefit systems in which one or more DIMMs may be removed, replaced, or added while the host computing system continues to operate.

While several embodiments of the invention have been discussed herein, other embodiments encompassed by the scope of the invention are possible. For example, while some embodiments of the invention are described above in specific reference to memory systems employing DIMMs carrying ×4 and ×8 DRAMs, memory systems employing other memory device types and configurations may benefit from other embodiments of the invention. Further, while only a single memory level is discussed with particularity in the foregoing embodiments, other embodiments may be devised which facilitate multiple memory levels, such as those incorporating one or more levels of memory cache. Also, aspects of one embodiment may be combined with those of alternative embodiments to create further implementations of the present invention. Thus, while the present invention has been described in the context of specific embodiments, such descriptions are provided for illustration and not limitation. Accordingly, the proper scope of the present invention is delimited only by the following claims.

What is claimed is:

1. The method comprising:
electronically detecting a corresponding bit-width of each rank of a memory, each rank comprising memory devices;
selecting an error correction algorithm from a plurality of error correction algorithms for each rank of the memory based upon the corresponding bit-width of a memory device in the rank, the plurality of error correction algorithms implemented by error correction logic associated with the memory; and
correcting an error in the memory device using the selected error correction algorithm.

2. The method of claim 1, wherein the memory devices of each rank span at least one memory module.

3. The method of claim 1, further comprising determining corresponding address boundaries for each rank of the memory.

4. The method of claim 1, wherein the memory devices of one of the ranks employ a different bit-width than the memory devices of another of the ranks.

5. The method of claim 1, wherein the memory devices of one of the ranks comprise at least one of a dynamic random access memory device or a static random access memory device.

6. The method of claim 1, further comprising:
constructing a table comprising an entry for each rank of the memory, wherein each entry comprises an indication of the corresponding bit-width of the associated rank; and
accessing one of the entries of the table to determine which of the plurality of error correction algorithms to employ when accessing the rank associated with the one of the entries.

7. The method of claim 6, wherein constructing the table occurs in response to the memory being powered up.

8. The method of claim 6, further comprising:
detecting at least one of a replacement of one of the ranks of the memory with a new rank, or an addition of the new rank; and
in response to detecting the at least one of the replacement or the addition, detecting a bit-width of the new rank and updating the entry of the table associated with the new rank with an indication of the corresponding bit-width of the new rank.

9. The method of claim 1, wherein electronically detecting the corresponding bit-widths of the ranks comprises reading configuration information from the memory.

10. The method of claim 9, wherein the configuration information is accessed according to a serial presence detect standard.

11. A method comprising:
selecting one of a plurality of error correction algorithms based on a bit-width of a memory device of a memory, the plurality of error correction algorithms implemented by error correction logic associated with the memory; and
correcting an error in the memory device using the selected error correction algorithm, wherein the at least one of the plurality of error correction algorithms comprises a Reed-Solomon error correction algorithm.

12. A memory controller for a memory comprising ranks, each rank comprising memory devices, the memory controller comprising;
control logic to detect a bit-width of a memory device of the memory, to select a first one of a plurality of error correction algorithms based on the bit-width of the memory device of the memory; and
error correction logic to correct a first error in the memory device using the first error correction algorithm and to correct a second error in one of the ranks using a second error correction algorithm different from the first error correction algorithm.

13. The memory controller of claim 12, wherein the memory devices of each rank span at least one memory module.

14. The memory controller of claim 12, wherein the control logic is to determine an address boundary for each rank of the memory.

15. The memory controller of claim 12, wherein the memory devices of one of the ranks employ a different bit-width than the memory devices of another of the ranks.

16. The memory controller of claim 12, wherein the memory devices of one of the ranks comprise at least one of a dynamic random access memory device or a static random access memory device.

17. The memory controller of claim 12, wherein the control logic is to:
construct a table comprising an entry for each rank of the memory, wherein each entry comprises an indication of the corresponding bit-width of the associated rank; and
access one of the entries of the table to select which of the plurality of error correction algorithms to employ when accessing the rank associated with the one of the entries.

18. The memory controller of claim 17, wherein the control logic is to construct the table when the memory is powered up.

19. The memory controller of claim 17, wherein the control logic is to:

detect at least one of a replacement of one of the ranks of the memory with a new rank, or an addition of the new rank; and
in response to detecting the at least one of the replacement or the addition, detect a bit-width of the new rank and update an entry of the table associated with the new rank with an indication of the corresponding bit-width of the new rank.

20. The memory controller of claim 12, wherein the control logic is to detect the corresponding bit-width of each rank of the memory by reading configuration information from the memory.

21. The memory controller of claim 20, wherein the control logic is to access the configuration information in accordance with a serial presence detect standard.

22. A memory controller comprising:
control logic to select one of a plurality of error correction algorithms based on a bit-width of a memory device of a memory; and
error correction logic configured to correct an error in the memory using the selected error correction algorithm, wherein the at least one of the plurality of error correction algorithms comprises a Reed-Solomon error correction algorithm.

23. A method comprising:
electronically detecting a corresponding bit-width of each rank of a memory, each rank comprising memory devices;
selecting, for each rank of the memory, an error correction algorithm from a plurality of error correction algorithms based upon the corresponding bit-width of the rank, the plurality of error correction algorithms implemented by error correction logic associated with the memory.

24. The method of claim 23, wherein the memory devices of one of the ranks employ a different bit-width than the memory devices of another of the ranks.

25. The method of claim 23, further comprising:
constructing a table comprising an entry for each rank of the memory, wherein each entry comprises an indication of the corresponding bit-width of the associated rank; and
accessing one of the entries of the table to determine which of the plurality of error correction algorithms to employ when accessing the rank associated with the one of the entries.

26. The method of claim 25, wherein constructing the table occurs in response to the memory being powered up.

27. The method of claim 25, further comprising:
detecting at least one of a replacement of one of the ranks of the memory with a new rank, or an addition of the new rank; and
in response to detecting the at least one of the replacement or the addition, detecting a bit-width of the new rank and updating the entry of the table associated with the new rank with an indication of the corresponding bit-width of the new rank.

28. The method of claim 23, wherein electronically detecting the corresponding bit-widths of the ranks comprises reading configuration information from the memory.

* * * * *